(12) United States Patent
Hinata et al.

(10) Patent No.: US 10,415,135 B2
(45) Date of Patent: Sep. 17, 2019

(54) THIN FILM FORMATION METHOD AND THIN FILM FORMATION APPARATUS

(75) Inventors: Yohei Hinata, Yokohama (JP);
Kyokuyo Sai, Yokohama (JP);
Yoshiyuki Otaki, Yokohama (JP);
Ichiro Shiono, Yokohama (JP);
Yousong Jiang, Yokohama (JP)

(73) Assignee: SHINCRON CO., LTD., Kanagawa (JP)

( * ) Notice: Subject to any disclaimer, the term of this patent is extended or adjusted under 35 U.S.C. 154(b) by 462 days.

(21) Appl. No.: 13/704,568

(22) PCT Filed: Jun. 13, 2011

(86) PCT No.: PCT/JP2011/063467
§ 371 (c)(1),
(2), (4) Date: Dec. 14, 2012

(87) PCT Pub. No.: WO2012/046474
PCT Pub. Date: Apr. 12, 2012

(65) Prior Publication Data
US 2013/0081942 A1 Apr. 4, 2013

(30) Foreign Application Priority Data

Oct. 8, 2010 (JP) .................................. 2010-228845

(51) Int. Cl.
*C23C 14/54* (2006.01)
*C23C 14/34* (2006.01)
(Continued)

(52) U.S. Cl.
CPC ........ *C23C 14/545* (2013.01); *C23C 14/3464* (2013.01); *C23C 14/3492* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 5,151,295 A | * | 9/1992 | Kawahara ................ G11B 7/26 204/192.13 |
| 5,724,145 A | | 3/1998 | Kondo et al. |

(Continued)

FOREIGN PATENT DOCUMENTS

| | | |
|---|---|---|
| JP | 8-120447 A | 5/1996 |
| JP | 9-33223 A | 2/1997 |

(Continued)

OTHER PUBLICATIONS

International Search Report for PCT/JP2011/063467 dated Jul. 19, 2011.

*Primary Examiner* — Jason Berman
(74) *Attorney, Agent, or Firm* — Kenealy Vaidya LLP

(57) ABSTRACT

A thin film formation method is provided, by which needless film formation due to trial film formation is omitted and film formation efficiency can be improved. This invention is a method for sputtering targets to form a film A having an intended film thickness of T1 as the first thin film on a substrate and monitor substrate held and rotated by a rotation drum and, subsequently, furthermore sputtering the targets used in forming the film A to form a film C having an intended film thickness of T3 as the second thin film, which is another thin film having the same composition as the film A; comprising film thickness monitoring steps S4 and S5, a stopping step S7, an actual time acquisition step S8, an actual rate calculating step S9 and a necessary time calculating step S24.

8 Claims, 9 Drawing Sheets

(51) Int. Cl.
*C23C 14/50* (2006.01)
*G02B 5/28* (2006.01)

(52) U.S. Cl.
CPC ............ *C23C 14/505* (2013.01); *C23C 14/54* (2013.01); *C23C 14/547* (2013.01); *G02B 5/28* (2013.01)

(56) References Cited

U.S. PATENT DOCUMENTS

| | | | |
|---|---|---|---|
| 5,911,858 A * | 6/1999 | Ruffner | ................ C23C 14/044 204/192.13 |
| 2003/0016346 A1* | 1/2003 | Umeda | ................ C23C 14/546 356/72 |
| 2004/0008435 A1 | 1/2004 | Takahashi et al. | |
| 2008/0223716 A1* | 9/2008 | Ockenfuss et al. | ...... 204/192.13 |

FOREIGN PATENT DOCUMENTS

| | | |
|---|---|---|
| JP | 11-121444 A | 4/1999 |
| JP | 2001-133228 A | 5/2001 |
| JP | 2001-183505 A | 7/2001 |
| JP | 2001-342563 A | 12/2001 |
| JP | 2003-279727 A | 10/2003 |
| JP | 2006-265739 A | 10/2006 |
| JP | 2010-138463 A | 6/2010 |

* cited by examiner

[Fig.1]
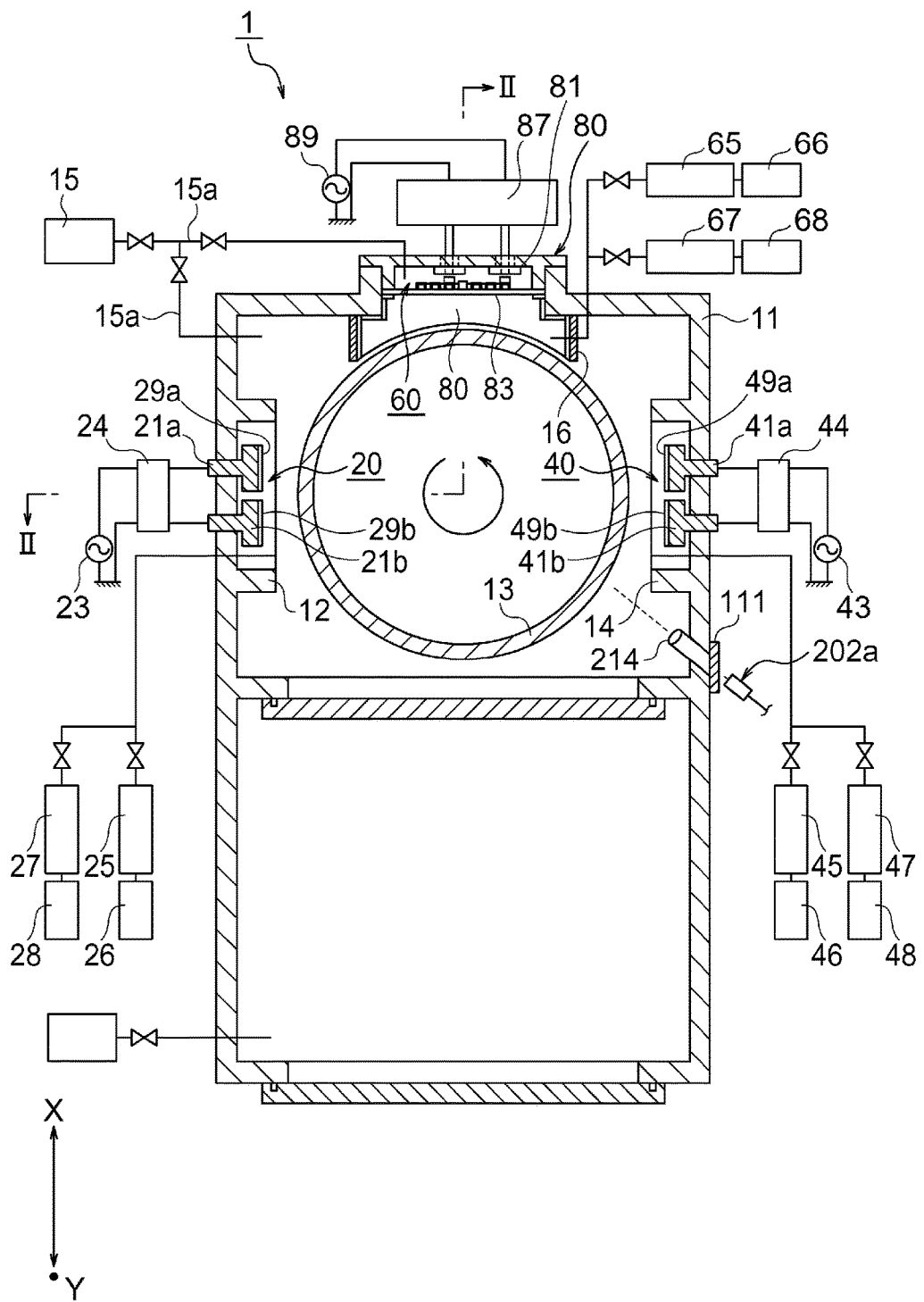

[Fig.2]
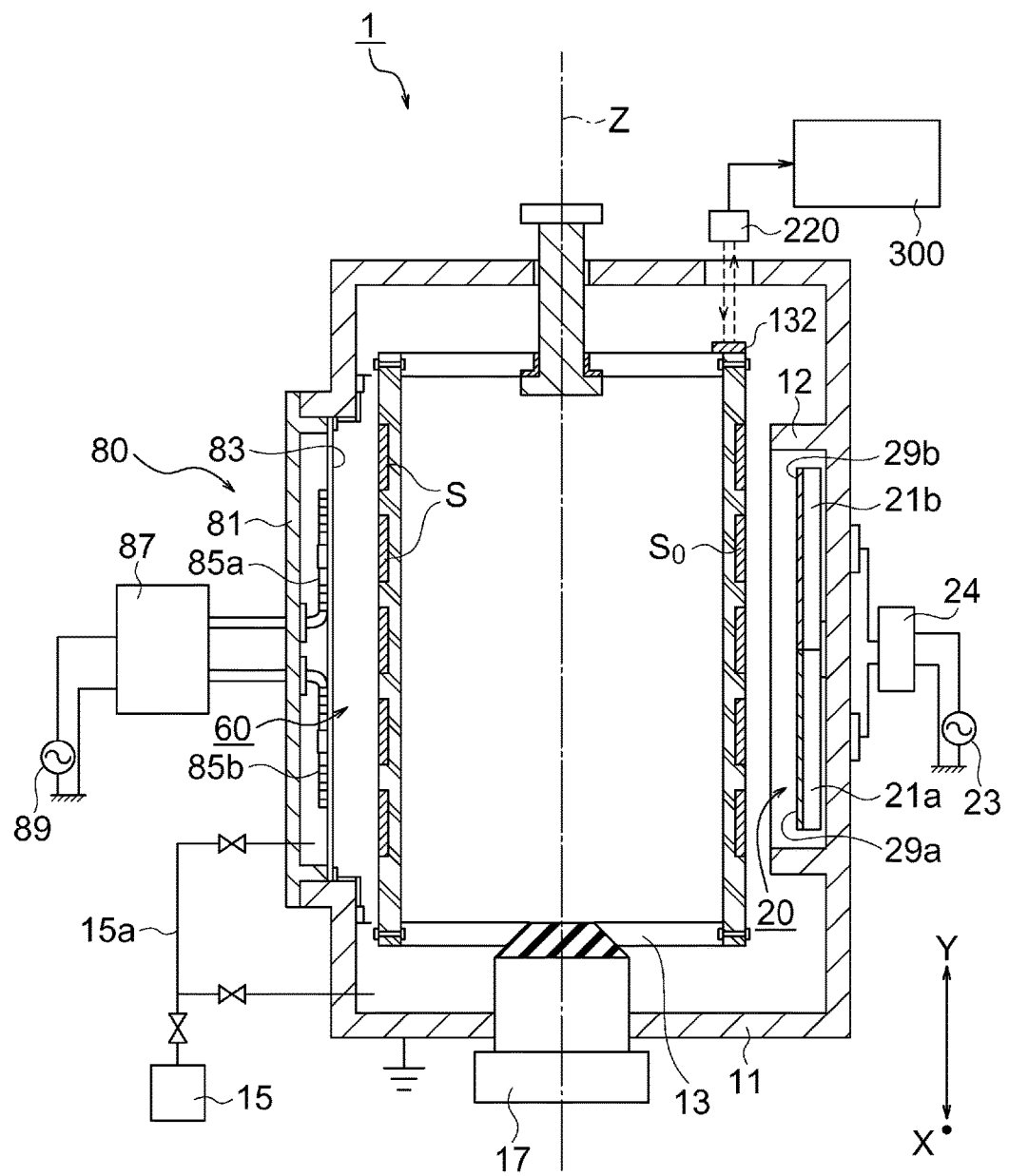

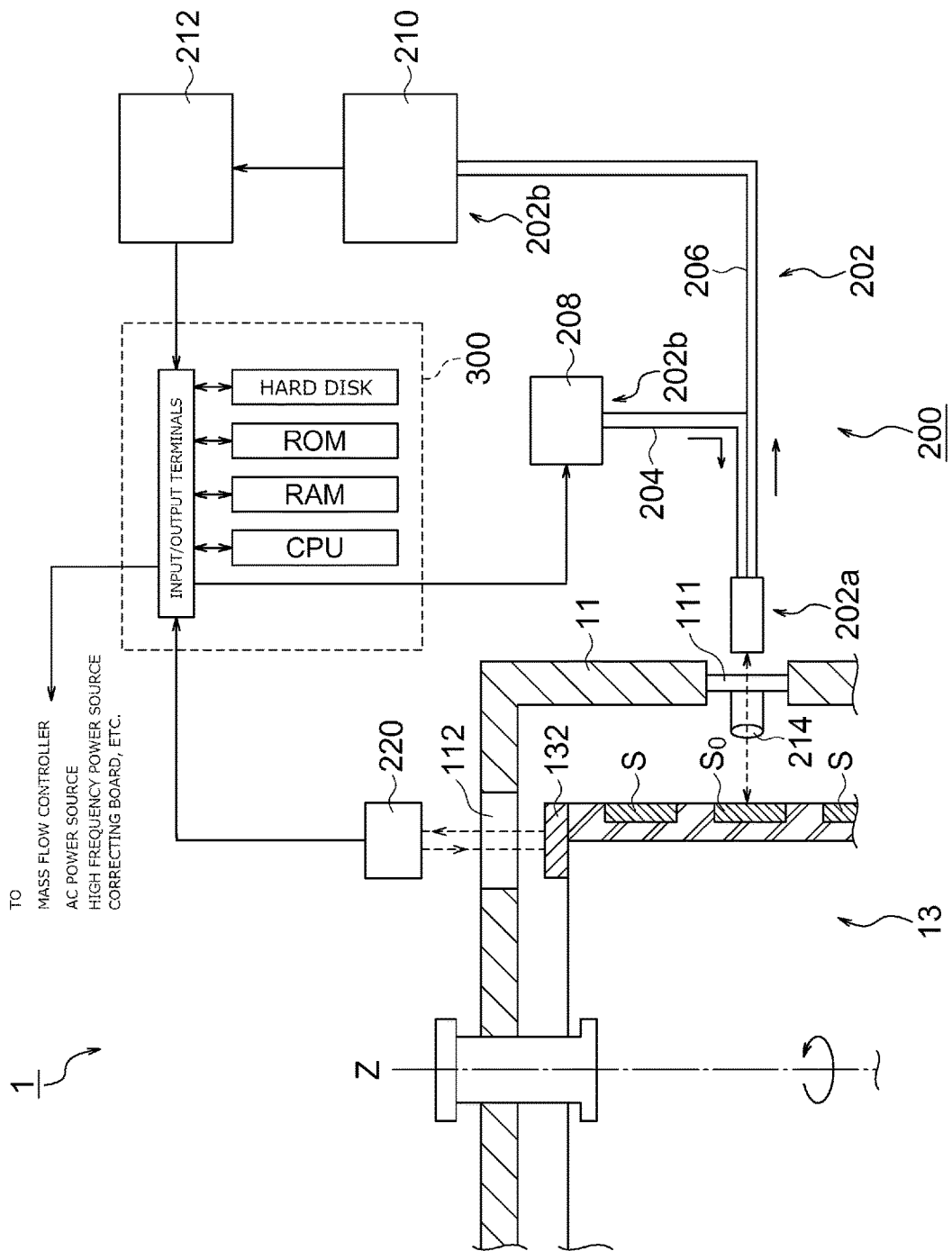
[Fig.3]

[Fig.4]
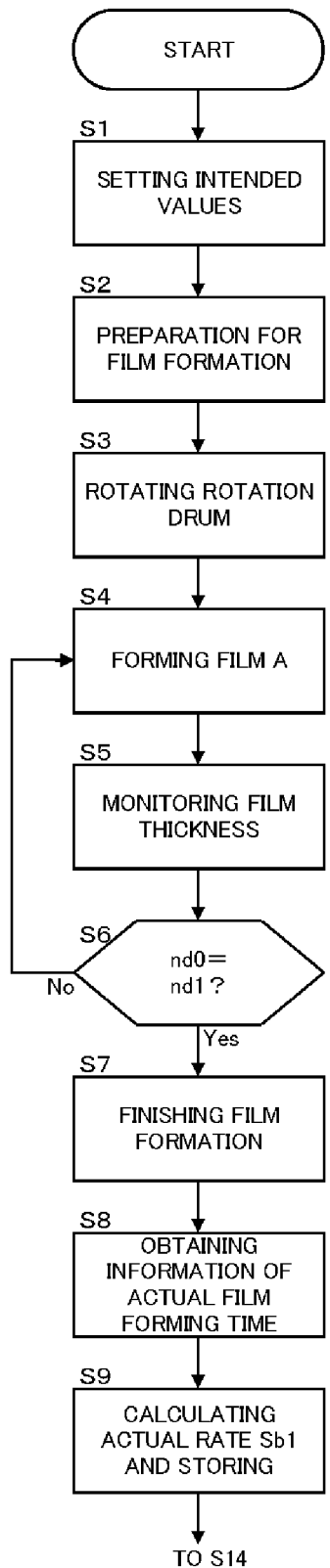

[Fig.5]
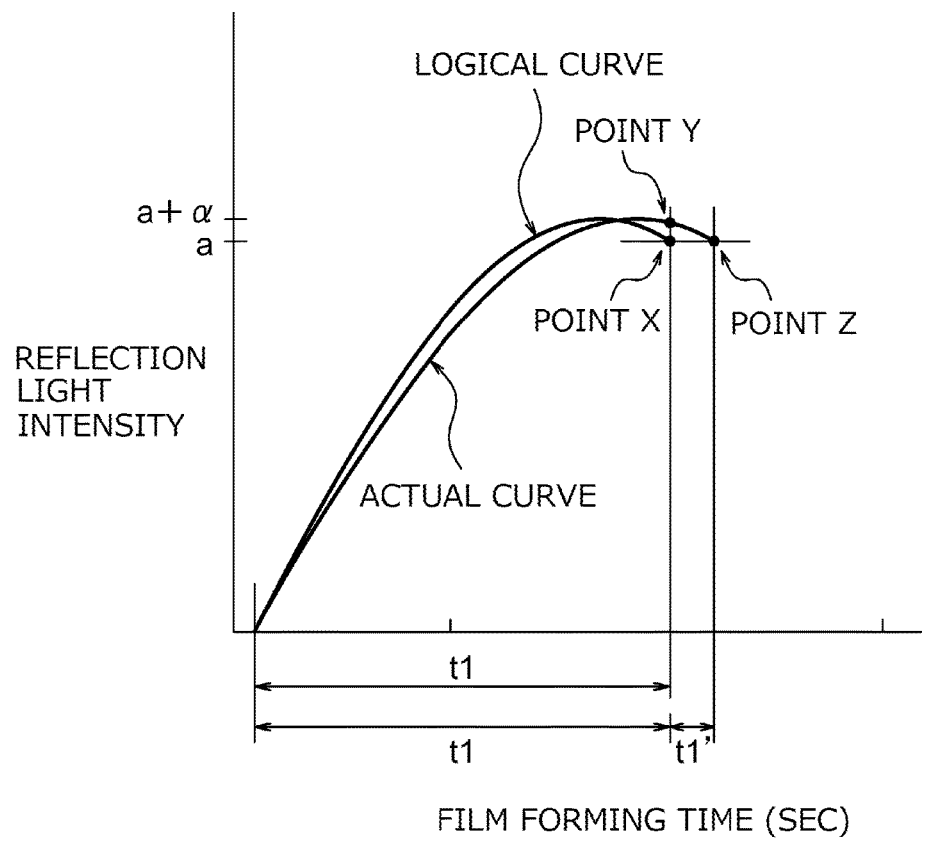

[Fig.6]
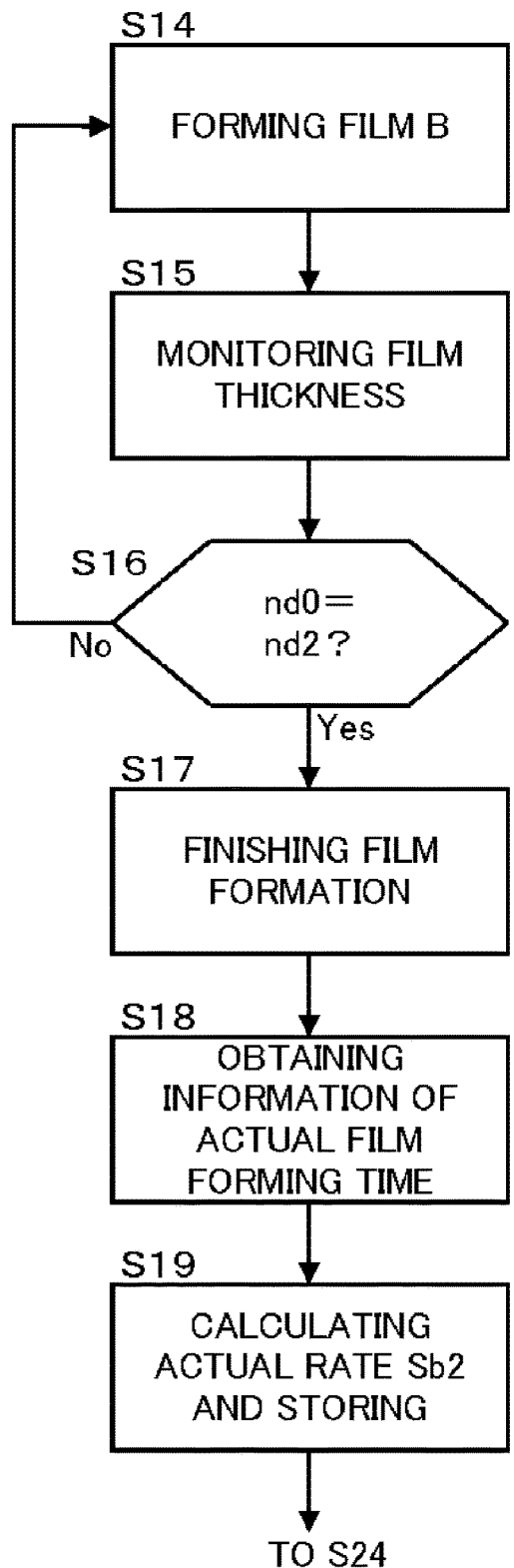

[Fig.7]
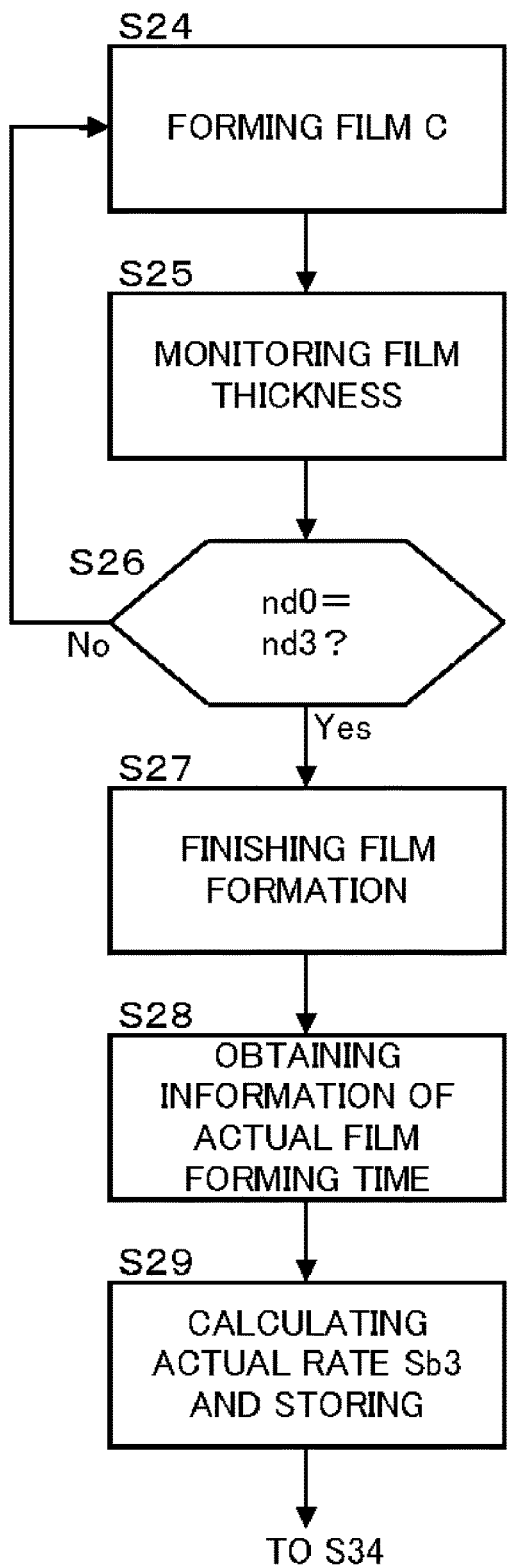

[Fig.8]
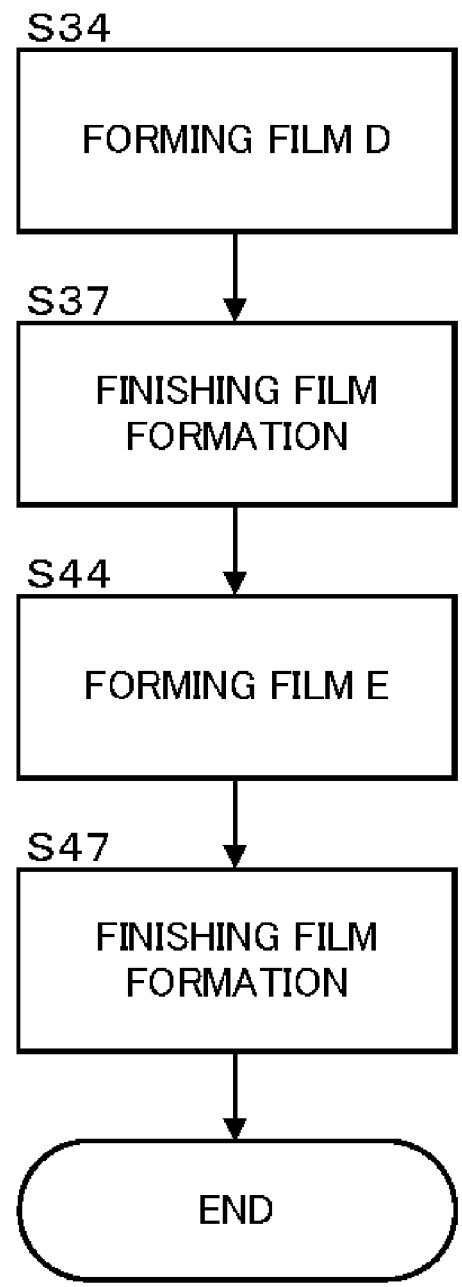

[Fig.9]
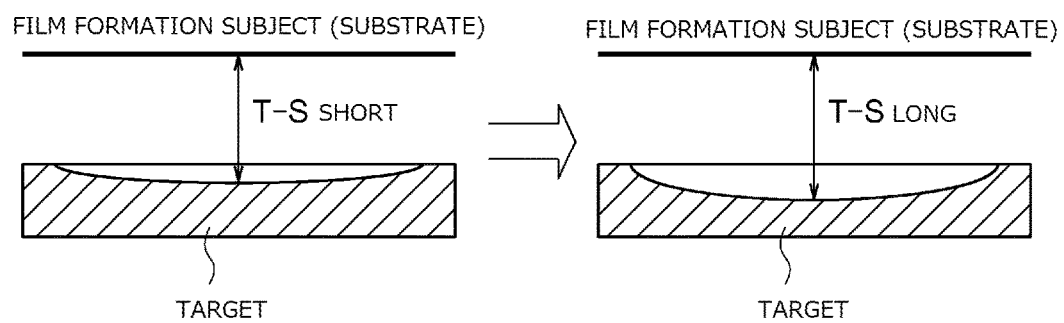

THIN FILM FORMATION METHOD AND THIN FILM FORMATION APPARATUS

This application is a U.S. national phase filing under 35 U.S.C. § 371 of PCT Application. No. PCT/JP2011/063467, filed on Jun. 13, 2011 and therefore also claims priority under 35 U.S.C. § 119 to Japanese patent application no. 2010-228845 filed on Oct. 8, 2010.

TECHNICAL FIELD

The present invention relates to a thin film formation method and a thin film formation apparatus.

BACKGROUND ART

It has been conventionally carried out to form an optical thin film on a substrate surface by using a thin film formation apparatus for adhering a film material to the substrate surface by sputtering in order to manufacture interference filters, such as anti-reflection filters, half mirrors, a variety of bandpass filters and dichroic filters, and other optical products (patent document 1).

RELATED ART DOCUMENTS

Patent Document

Patent Document 1: Japanese Patent Unexamined Publication (Kokai) No. 2001-133228

SUMMARY OF THE DISCLOSED SUBJECT MATTER

In methods of the related art for manufacturing optical products by using a thin film formation apparatus of this kind, steps below were performed. First, a trial film is formed. Specifically, a substrate as a film formation subject is set in a vacuum container (chamber) and an optical thin film is formed on the substrate under the condition (T (nm)=S (nm/sec)×t (sec), wherein T indicates an intended film thickness, S indicates an interim film forming rate and 't' indicates interim film forming time) at being designed. Next, the substrate after the film formation is taken out from the chamber and actual spectroscopic characteristics of the optical thin film formed thereon are observed. Specifically, a spectral photometer is used to measure photometry of the optical thin film formed on the substrate to confirm whether it is formed to have a desired film thickness to bring intended optical characteristics or not.

Next, a rate difference obtained from a difference of actual optical characteristics and those at being designed is calculated (simulated), and real film formation is performed with a film forming rate on the ground of this rate difference.

In the method of the related art as explained above, several batches of trial film formation are performed to obtain a stabilized film forming condition before performing real film formation. Particularly, in the case where an optical thin film is configured by a multilayer film, the test film formation and simulation as above have to be done for each single layer before real film formation. Therefore, lots of time and work have been necessary before the real film formation and that have resulted in undermining the entire film forming efficiency.

According to an aspect of the present invention, a thin film formation method and an apparatus are provided, with which a film forming efficiency can be improved.

The present invention attains the aspect above by the means for attaining the object below. Note that an explanation will be made with numerical notations corresponding to drawings showing an embodiment of the invention in the means for attaining the object, however, the numerical notations are for facilitating understanding of the invention and not for limiting the invention.

The thin film formation method according to the invention is a method for sputtering a target (29a, 29b, 49a and 49b) to form a first thin film (film A, film B and film C) having an intended film thickness (T1, T2 and T3) on a substrate (S and S0) held and rotated by a substrate holding means (13) and, subsequently, further sputtering the targets (29a, 29b, 49a and 49b) used for forming the first thin film (film A, film B and film C) to form a second thin film (film C, film D and film E) having an intended film thickness (T3, T4 and T5), which is another thin film having the same composition as the first thin film (film A, film B and film C); and comprises a film thickness monitoring step, a stopping step, an actual time acquisition step, an actual rate calculation step and a necessary time calculation step.

The film thickness monitoring step (S5, S15 and S25) monitors a film thickness (T0) of the first thin film (film A, film B and film C) while forming the first thin film (film A, film B and film C) by supplying film materials to the substrate (S and S0).

The stopping step (S7, S17 and S27) stops supplying the film materials when a film thickness (T0) of the first thin film (film A, film B and film C) reaches an intended film thickness (T1, T2 and T3).

The actual time acquisition step (S8, S18 and S28) obtains information of actual film forming time (t1+t1', t2+t2' and t3+t3'), which is film forming time actually required from start of supplying the film materials till termination of the supply.

The actual rate calculation step (S9, S19 and S29) calculates an actual film forming rate (Sb1, Sb2 and Sb3), which is a film forming rate actually used for forming the first thin film (film A, film B and film C), based on the actual film forming time (t1+t1', t2+t2' and t3+t3').

The necessary time calculation step (S24, S34 and S44) calculates necessary time (t3, t4 and t5), which is film forming time necessary for forming the second thin film (film C, film D and film E) having an intended film thickness (T3, T4 and T5), based on the actual film forming rate (Sb1, Sb2 and Sb3).

Then, film formation starts at the actual film forming rate (Sb1, Sb2 and Sb3) and the film materials are supplied to the substrate (S and S0) till the necessary time (t3, t4 and t5) passes when forming the second thin film (film C, film D and film E) having an intended film thickness (T3, T4 and T5).

The thin film formation apparatus (1) according to the invention is an apparatus for sputtering a target (29a, 29b, 49a and 49b) to form a first thin film (film A, film B and film C) having an intended film thickness (T1, T2 and T3) on a substrate (S and S0) and, subsequently, further sputtering the target used for forming the first thin film (film A, film B and film C) to form a second thin film (film C, film D and film E) having an intended film thickness (T3, T4 and T5), which is another thin film having the same composition as the first thin film (film A, film B and film C); and comprises a substrate holding means and a sputtering means, a film thickness monitoring means and a control means.

The substrate holding means (13) is provided inside a vacuum container (11) and holds substrates (S and S0) on a side surface in a rotation direction of a rotation means (13), which is rotatable about an axis (Z).

The sputtering means forms the first thin film (film A, film B and film C) and the second thin film (film C, film D and film E) respectively having intended film thicknesses (T1, T2, T3, T4 and T5) by using same target (29a, 29b, 49a and 49b).

The film thickness monitoring means (200) monitors a film thickness (T0) of the first thin film (film A, film B and film C).

The control means (300) retrieves information of actual film forming time (t1+t1', t2+t2' and t3+t3'), which is film forming time required from start of supplying film materials till termination thereof in forming a first thin film (film A, film B and film C) by the sputtering means; calculating an actual film forming rate (Sb1, Sb2 and Sb3), which is a film forming rate actually used for forming the first thin film (film A, film B and film C) having an intended film thickness (T1, T2 and T3), based on the actual film forming time (t1+t1', t2+t2' and t3+t3'); calculating necessary time (t3, t4 and t5), which is film forming time required for forming a second thin film (film C, film D and film E) having an intended film thickness (T3, T4 and T5), based on the actual film forming rate (Sb1, Sb2 and Sb3); and adjusting a film formation condition of the second thin film (film C, film D and film E). Furthermore, the control means (300) controls to start film formation at the actual film forming rate (Sb1, Sb2 and Sb3) and to supply film materials to the substrate (S and S0) until the necessary time (t3, t4 and t5) passes in forming the second thin film (film C, film D and film E) having an intended film thickness (T3, T4 and T5).

The thin film formation method using the thin film formation apparatus of the present invention relates to a method of sputtering a target first to form a first thin film to have an intended film thickness on a substrate held and rotated by a substrate holding means, then, providing a third thin film having a different composition from the first thin film when required (namely, depositing a third thin film on the first thin film), subsequently, furthermore sputtering the target used in forming the first thin film to form a second thin film, which has the same composition as the first thin film, to have an intended film thickness. Namely, the present invention relates to a method of using a same target for several batches and sputtering the same so as to form a first thin film and the second thin film (each being a thin film having the same composition) on a substrate held and rotated by the substrate holding means.

When a target to be used in the method of the present invention is a metal target, such as silicon (Si) and niobium (Nb), the target surface tends to be gradually chipped as the film forming time passes (in detail, the number of batches to be processed increases). Due to the chipping of the target, a distance between the target surface and the substrate as a film forming subject (hereinafter referred to as abbreviated "T-S") becomes longer (refer to FIG. 9). It is the same as the cases of undesired decline of sputtering power and a decline of supply flow amount of a sputtering gas, but a decline of an estimated film forming rate (for example, an interim rate Sa1) in performing film formation for predetermined time (for example, time t1) for an intended film thickness (for example, T1) is caused also by an increase of T-S. The decline of film forming rate increases as chipping on the target becomes larger, that is, as the T-S becomes longer and, eventually, when stopping a film formation power after a designated time (t1) and measuring spectroscopic characteristics of the thin film, intended spectroscopic characteristics cannot be obtained because the thin film does not reach the intended film thickness (T1).

Therefore, in the present invention, when using a same target for a plurality of batches, an actual film forming rate (actual rate) of a thin film formed first (first thin film) is calculated and the rate is used as an estimated rate for forming another thin film having the same composition as the first thin film for a predetermined time and, thereby, trial film formation can be omitted before performing real film formation, so that the entire film formation efficiency can be improved.

In the method of the present invention, for example, when forming an optical multilayer film, wherein two kinds of single-layer thin films composed of different materials (for example, a $SiO_2$ film and $Nb_2O_5$ film) are deposited alternately for a plurality of times (for example, tens of layers), it is preferable to calculate an actual rate of thin film formation at most-initial-possible stage (for example, at thin film formation from the first layer to the third layer or so of respective kinds of single-layer thin films), and reflect the actual rate in a film forming rate in subsequent thin film formation. As a result of calculating an actual rate at the time of thin film formation at an initial stage and reflecting it in subsequent thin film formation, more contribution is expected to furthermore improve the film formation efficiency.

However, the present invention does not exclude the case of calculating an actual rate in thin film formation after a while from the start of thin film formation, for example, after the third layer or so of respective kinds of single-layer thin films and reflecting it in a film forming rate in subsequent thin film formation.

BRIEF DESCRIPTION OF DRAWINGS

FIG. 1 is a partial crosswise sectional view seen from above a sputtering apparatus according to the present embodiment.

FIG. 2 is a partial vertical sectional view along the line II-II in FIG. 1.

FIG. 3 is a functional block diagram showing a configuration example of a film thickness monitoring device used in a thin film formation apparatus in FIG. 1.

FIG. 4 is a flowchart showing a flow of thin film formation processing (first layer) of the present embodiment.

FIG. 5 is a view showing a reference example of a light intensity change curve at determining in S6 in FIG. 4.

FIG. 6 is a flowchart showing a flow of thin film formation processing (second layer) of the present embodiment.

FIG. 7 is a flowchart showing a flow of thin film formation processing (third layer) of the present embodiment.

FIG. 8 is a flowchart showing a flow of thin film formation processing (fourth and fifth layers) of the present embodiment.

FIG. 9 is a reference drawing for explaining a distance relationship between a target and a film formation subject affected by chipping on the target.

DESCRIPTION OF NUMERICAL NOTATIONS

1 . . . sputtering apparatus (thin film formation apparatus), 11 . . . vacuum container, 12,14 and 16 . . . partition wall, 13 . . . rotation drum (rotation means, substrate holding means), 132 . . . timing detecting reflection plate, 17 . . . motor, S . . . substrate, S0 . . . monitor substrate, 20 and 40 . . . film formation process region Sputtering source (21a, 21b, 41a, 41b . . . magnetron sputtering electrode, 23 and 43 . . . AC power source, 24 and 44 . . . transformer, 29a, 29b, 49a and 49b . . . target)

Sputtering gas supply means (26, 46 . . . reactive gas cylinder, 28 and 48 . . . inert gas cylinder, 25, 27, 45 and 47 . . . mass flow controller), 60 . . . reaction process region 80 . . . plasma source (81 . . . case body, 83 . . . dielectric plate, 85a and 85b . . . antenna, 87 . . . matching box, 89 . . . high frequency power source), reaction treatment gas supply means (66 . . . reactive gas cylinder, 68 . . . inert gas cylinder, 65 and 67 . . . mass flow controller), 200 . . . film thickness monitoring device (film thickness monitoring means), 202 . . . complex optical fiber bundle, 204 . . . light-transmitting side optical fiber bundle, 206 . . . light-receiving side optical fiber bundle, 208 . . . light source, 210 . . . photoelectric conversion element, 212 . . . controller, 214 . . . condenser lens, 220 . . . timing sensor, 300 . . . control device (control means)

EXEMPLARY MODE FOR CARRYING OUT THE DISCLOSED SUBJECT MATTER

Blow, an embodiment of the invention explained above will be explained based on the drawings.

In the present embodiment, a sputtering apparatus 1 for performing magnetron sputtering as an example of sputtering is used but it is not limited to this, and sputtering apparatuses for performing double-pole sputtering and other well-known sputtering may be also used.

The sputtering apparatus 1 of the present embodiment is used for forming a multilayer film by depositing a plurality of single-layer thin films each having an intended film thickness on a substrate by repeating sputtering processing and plasma processing. In the present embodiment, sputtering processing and plasma processing are performed for one time when a rotation drum rotates once. Thereby, an ultra-thin film having a film thickness of 0.01 nm to 1.5 nm or so in average is formed (thin film formation processing). By repeating the thin film formation processing for every rotation of the rotation drum, next ultrathin film is deposited on that ultrathin film and on, consequently, a single-layer thin film having an intended film thickness of several nm to hundreds of nm or so is formed on the substrate. A plurality of these single-layer thin films are deposited to form a multilayer film.

<Thin Film Formation Apparatus>

As shown in FIG. 1 and FIG. 2, the sputtering apparatus 1 of the present embodiment as an example of thin film formation apparatuses comprises a vacuum container 11 having an approximate rectangular parallelepiped hallow shape. A pipe 15a for exhaust is connected to the vacuum container 11 and the pipe is connected to a vacuum pump 15 for evacuating inside the container 11. The vacuum pump 15 is configured, for example, by a rotary pump and turbo molecular pump (TMP), etc. A rotation drum 13 is provided inside the vacuum container 11. The rotation drum 13 (an example of a substrate holding means) is configured by a cylinder-shaped member capable of holding inside the vacuum container 11a substrate S, on which a film is formed, on its outer circumferential surface. The rotation drum 13 of the present embodiment is provided in the vacuum container 11, so that a rotation axis Z extending in the cylindrical direction is in the vertical direction (Y direction) of the vacuum container 11. By driving a motor 17, the rotation drum 13 rotates about the axis Z. Note that a timing detecting reflection plate 132 is attached at a rim of an upper end of the rotation drum 13 and a timing sensor 220 detects when it passes through.

In the present embodiment, around the rotation drum 13 inside the vacuum container 11, two sputtering sources and one plasma source 80 are provided. The sputtering source may be just one.

The respective sputtering sources in the present embodiment are configured to be a dual cathode type provided with two magnetron sputtering electrodes 21a and 21b (or 41a and 41b). When forming a film, targets 29a and 29b (or 49a and 49b) composed of film materials, such as metal, are respectively held in a detachable way on surfaces of one end side of the electrodes 21a and 21b (or 41a and 41b). On the other end side of the electrodes 21a and 21b (or 41a and 41b), an AC power source 23 (or 43) as a power supply means is connected via a transformer 24 (or 44) as a power control means for adjusting the electric energy, so that it is configured to that an AC voltage of, for example, 1 k to 100 kHz or so is applied to the respective electrodes 21a and 21b (or 41a and 41b).

Each of the sputtering sources is connected to a sputtering gas supply means. The sputtering gas supply means of the present embodiment comprises a reactive gas cylinder 26 (or 46) for storing a reactive gas as an example of a sputtering gas, a mass flow controller 25 (or 45) for adjusting a flow amount of a reactive gas supplied from the reactive gas cylinder 26 (or 46), an inert gas cylinder 28 (or 48) for storing an inert gas as an example of a sputtering gas and a mass flow controller 27 (or 47) for adjusting a flow amount of an inert gas supplied from the inert gas cylinder 28 (or 48).

The sputtering gases are introduced respectively to a film formation process region 20 (or 40) through pipes. The mass flow controllers 25 and 27 (or 45 and 47) are devices for adjusting a flow amount of sputtering gases. After flow amounts are adjusted by the mass flow controllers 25 and 27 (or 45 and 47), the sputtering gases from the cylinders 26 and 28 (or 46 and 48) are introduced to the film formation process region 20 (or 40).

The plasma source 80 of the present embodiment comprises a case body 81 fixed to cover an opening formed on a wall surface of the vacuum container 11 and a dielectric plate 83 fixed to the case body 81. It is configured that, as a result that the dielectric plate 83 is fixed to the case body 81, an antenna housing chamber is formed in a region surrounded by the case body 81 and the dielectric plate 83. The antenna housing chamber is connected with the vacuum pump 15 through a pipe 15a, and a vacuum state can be attained by exhausting inside the antenna housing chamber by vacuuming using the vacuum pump 15.

The plasma source 80 comprises antennas 85a and 85b in addition to the case body 81 and the dielectric plate 83. The antennas 85a and 85b are connected to a high frequency power source 89 via a matching box 87 for housing a matching circuit. The antennas 85a and 85b are supplied with power from the high frequency power source 89 and generate an induction field inside the vacuum container 11 (reaction process region 60), so that plasma is generated in the reaction process region 60. In the present embodiment, it is configured that an AC voltage having a frequency of 1 to 27 MHz is applied from the high frequency power source 89 to the antennas 85a and 85b to generate plasma of reaction processing gas in the reaction process region 60. A variable capacitor is provided in the matching box 87, so that the power supplied from the high frequency power source 89 to the antennas 85a and 85b can be changed.

The plasma source 80 is connected to a reaction processing gas supply means. The reaction processing gas supply means of the present embodiment comprises a reactive gas cylinder 66 for storing a reactive gas as an example of a reaction processing gas, a mass flow controller 65 for adjusting a flow amount of a reactive gas to be supplied from the reactive gas cylinder 66, an inert gas cylinder 68 for storing an inert gas as an example of a reaction processing gas, and a mass flow controller 67 for adjusting a flow amount of an inert gas supplied from the inert gas cylinder 68.

A reaction processing gas is introduced to the reaction process region 60 through a pipe. The mass flow controllers 65 and 67 are devices for adjusting a flow amount of the reaction processing gas. After flow amounts are adjusted by the mass flow controllers 65 and 67, the reaction processing gases from the cylinders 66 and 68 are introduced to the reaction process region 60.

Note that the reactive gas cylinder 66 and the inert gas cylinder 68 may be the same device as the reactive gas cylinders 26 and 46 and inert gas cylinders 28 and 48 for the film formation process regions 20 and 40, or the same device may be shared. As to the mass flow controller 65 and the mass flow controllers 67, the same devices as the mass flow controllers 25 and 27 (or 45 and 47) for the film formation process regions 20 and 40 may be used, or the same device may be shared.

In front of the respective sputtering sources in the present embodiment, film formation process regions 20 and 40 are formed, respectively. The regions 20 and 40 are respectively surrounded from four directions by partition walls 12 and 14 protruding from an inner wall surface of the vacuum container 11 toward the rotation drum 13, so that an independent space can be secured for each of the regions inside the vacuum container 11. In the same way, a reaction process region 60 is formed in front of the plasma source 80. The region 60 is also surrounded from four directions by partition walls 16 protruding from the inner wall surface of the vacuum container 11 toward the rotation drum 13 and, thereby, a space is also secured for the region 60 independently from the regions 20 and 40 inside the vacuum container 11.

With drive of the motor 17, the rotation drum 13 rotates about the axis Z, then, the substrate S held on the outer circumferential surface of the rotation drum 13 revolves about the axis Z, an axis of rotation of the rotation drum 13, and moves repeatedly among positions facing to the film formation process regions 20 and 40 and a position facing to the reaction process region 60. And sputtering processing performed in the region 20 or 40 and plasma processing performed in the region 60 are repeated successively to form a final thin film having a predetermined film thickness on the surface of the substrate S.

The sputtering processing is performed, for example, as below. When a predetermined flow amount of a sputtering gas is introduced from the reactive gas cylinder 26 (or 46) for storing a reactive gas and the inert gas cylinder 28 (or 48) for storing an inert gas via the mass flow controllers 25 and 27 (or 45 and 47) to the film formation process region 20 (or 40), the vicinity of the targets 29a and 29b (or 49a and 49b) becomes a predetermined gas atmosphere. In this state, an AC voltage from the AC power source 23 (or 43) is applied to respective electrodes 21a and 21b (or 41a and 41b) via a transformer 22 (or 42) so as to apply an alternating electric field to the targets 29a and 29b (or 49a and 49b). Thereby, at one point, the target 29a (or 49a) becomes cathode (negative electrode) and the target 29b (or 49b) inevitably becomes anode (positive electrode) at the time. At the next moment, when the direction of the alternating power changes, the target 29b (or 49b) becomes cathode (negative electrode) and the target 29a (or 49a) becomes anode (positive electrode). As a result that targets 29a and 29b (or 49a and 49b) in a pair alternately become anode and cathode in this way, a part of the sputtering gas around the targets 29a and 29b (or 49a and 49b) emits electrons and becomes ionized. A leakage magnetic field is formed on the surfaces of the targets 29a and 29b (or 49a and 49b) by magnets arranged at the electrodes 21a and 21b (or 41a and 41b), therefore, the electrons go around drawing a toroidal curve in the magnetic field generated near the surfaces of the targets 29a and 29b (or 49a and 49b). Strong plasma is generated along the orbit of the electrons, ions of the sputtering gas in the plasma are accelerated toward a target in a negative potential state (cathode side) to collide with each of the targets 29a and 29b (or 49a and 49b), so that atoms and particles (Si atoms and Si particles when the targets 29a and 29b are Si, and Nb atoms and Nb particles when the targets 49a and 49b are Nb) on the surfaces of the targets 29a and 29b (or 49a and 49b) are beaten out (sputtered). These atoms and particles are film materials, materials for a thin film, which adhere to the surface of the substrate S to form an interlayer thin film.

Non-conductive or low-conductive incomplete oxides, etc. may adhere to the anode during sputtering in some cases, however, when the anode is converted to cathode by the alternating electric field, the incomplete oxides, etc. are sputtered and the target surface restores the original clean state. Also, as a result that the targets 29a and 29b in a pair alternately and repeatedly become anode and cathode, stable anode potential state can be always obtained, a change of a plasma potential (normally almost equal to the anode potential) is prevented, and an interlayer thin film is formed stably on the surface of the substrate S.

In the present embodiment, a plurality of substrates S are arranged on the outer circumferential surface of the rotation drum 13 discontinuously along the rotation direction (crossing direction) of the rotation drum 13, and a plurality of substrates S are arranged discontinuously along the parallel direction (Y direction, vertical direction) with the axis Z of the rotation drum 13. In the present embodiment, a monitor substrate S0 to be monitored is included as a part of the plurality of substrates S.

The substrate S as a film formation subject may be configured by a plastic material, ceramic material and metal, etc. besides glass material (for example, silica glass, soda-lime glass and borosilicate glass, etc.) made by silicon oxide ($SiO_2$).

The monitor substrate S0 to be monitored may be configured by a material, with which the optical characteristics of the monitor substrate S0 change due to a difference of refractive indexes and arising of absorption by a thin film, etc. and with which correlation stands between the change and the substrate S as a film formation subject.

The targets 29a and 29b (or 49a and 49b) are film materials formed into a plate shape. In the present embodiment, it is formed so that a shape in the direction facing to the outer circumferential surface of the rotation drum 13, that is, a shape in a planar view is square. However, the shape is not limited to that and it may be formed into other shapes, such as a true circle, oval and polygonal shape.

Each of the targets 29*a* and 29*b* (or 49*a* and 49*b*) is held detachably on a surface of one end side explained above of each of the electrodes 21*a* and 21*b* (or 41*a* and 41*b*), so that its surface in the planar direction faces the vertical direction with respect to the axis Z of the rotation drum 13.

As a material of the targets 29*a* and 29*b* (or 49*a* and 49*b*), for example, Si, Nb, Al, Ti, Zr, Sn, Cr, Ta, Te, Fe, Mg, Hf, Ni—Cr, In—Sn and other variety of metals may be used. Also, it is not limited to a single kind of metal but a plurality of kinds of metals may be used as the targets. Furthermore, compounds of these metals, for example, $Al_2O_3$, $TiO_2$, $ZrO_2$, $Ta_2O_5$ and $HfO_2$, etc. may be also used.

Plasma processing is performed, for example, as below. When a predetermined flow amount of a reaction processing gas is introduced from the reactive gas cylinder 66 for storing a reactive gas and the inert gas cylinder 68 for storing an inert gas to the reaction process region 60 via the mass flow controllers 65 and 67, the vicinity of the antennas 85*a* and 85*b* becomes a predetermined gas atmosphere. In this state, when the antennas 85*a* and 85*b* are applied with a voltage having a frequency of 1 to 27 MHz from the high frequency power source 89, plasma arises in a region facing to the antennas 85*a* and 85*b* in the reaction process region 60. Thereby, the interlayer thin film formed on the surface of the substrate S in the film formation process region 20 or 40 is subjected to plasma processing, by which film conversion to complete reactant and incomplete reactants of the film materials is performed so as to form an ultrathin film.

In the present embodiment, for example, argon and helium, etc. are possible as the inert gas, and, for example, an oxygen gas, nitrogen gas, fluorine gas and ozone gas, etc. are possible as the reactive gas.

In the present embodiment, an interlayer thin film is formed on the surface of the substrate S by the sputtering processing explained above and, after that, the interlayer film is subjected to film conversion by the plasma processing explained above so as to form an ultrathin film having a film thickness of 0.01 nm to 1.5 nm or so in average. As a result of performing the sputtering processing and the plasma processing repeatedly, next ultrathin film is deposited on an ultrathin film and on. This operation will be repeated until reaching to the final thin film (single layer thin film) having an intended film thickness of several nm to hundreds of nm or so.

Note that "an interlayer thin film" is a thin film composed of a metal composing the targets 29*a* and 29*b* (or 49*a* and 49*b*) or incomplete oxides thereof and is formed in the region 20 (or 40) in the present embodiment. As to the term "ultrathin film", because a plurality of the ultrathin films are deposited to form the final thin film (a thin film having an intended film thickness), the term "ultrathin film" is used for preventing confusing it with the finally obtained "thin film" and also used in a meaning that it is well thinner than the final "thin film".

<Film Thickness Monitoring Device>

As shown in FIG. 3, the sputtering apparatus 1 of the present embodiment comprises a light reflection-type film thickness monitoring device 200. The film thickness monitoring device 200 corresponds to "a film thickness monitoring means" of the present invention. Note that it is not limited to light reflection type and a light transmission type film thickness monitoring device may be also used.

The film thickness monitoring device 200 of the present embodiment irradiates a light (wavelength λ) to the monitor substrate S0 held and rotated by the rotation drum 13, detects light intensity of a reflection light from the monitor substrate S0 to detect an optical film thickness 'nd' ('n' indicates a refractive index of film materials, and 'd' indicates a geometric film thickness) of a thin film being formed on the monitor substrate S0 and monitors the same.

As film formation by the sputtering apparatus 1 proceeds, an optical film thickness of the thin film to be formed on the monitor substrate S0 increases. Along therewith, light intensity of a reflection light from the monitor substrate S0 increases or decreases, and when a thin film having an optical film thickness of ¼ of a measured wavelength λ is formed, the light intensity of the reflection light from the monitor substrate S0 exhibits an extremal value (minimum value or maximum value).

The film thickness monitoring device 200 of the present embodiment comprises a complex optical fiber bundle 202. In the complex optical fiber bundle 202, a light-transmitting side optical fiber bundle 204 and light-receiving side optical fiber bundle 206 are integrated at one end side 202*a* placed outside the vacuum container 11, and at the other end side 202*b*, the other end side of the light-transmitting side optical fiber bundle 204 and that of the light-receiving optical fiber bundle 206 are divided. The light-transmitting side optical fiber bundle 204 and the light-receiving optical fiber bundle 206 are integrated by putting respective plurality of optical fibers (illustration is omitted) together.

The other end side of the light-transmitting side optical fiber bundle 204 is provided with a light source 208, etc. for emitting light, and the other end side of the light-receiving side optical fiber bundle 206 is provided with a photoelectric conversion element 210 and a controller 212, etc. via a dispersion optical system (for example, a spectroscope and optical interference filter, etc. illustration is omitted) which, for example, transmits only a predetermined wavelength. Inside the vacuum container 11, a condenser lens 214 may be provided between one end side 202*a* of the complex optical fiber bundle 202 and the monitor substrate S0. Thereby, a measurement light emitted from one end side 202*a* converges due to the condenser lens 214 before being irradiated to the monitor substrate S0.

The timing sensor 220 in FIG. 3 is configured, for example, by a photoelectric sensor, etc. and every time the rotation drum 13 rotates once about the axis Z and passing of a timing detecting reflection plate 132 attached to a rim of the upper side of the rotation drum 13 is detected through a vacuum glass window 112 sealed at the upper end portion of the vacuum container 11 (in other words, every time the monitor substrate S0 moves to the measurement position during rotation of the rotation drum 13), it outputs a film thickness detection monitoring signal to the control device 300.

The monitor substrate S0 is to be monitored for film thickness monitoring and, in the same way as other substrates S, a thin film is formed on the front surface in the film formation process regions 20 and 40 (namely, the surface irradiated with a measurement light), and conversion of a film composition thereof is performed in the reaction process region 60. Since a film thickness of the thin film formed on the monitor substrate S0 and a film thickness of a thin film formed on the substrate S as a film formation subject exhibit certain correlation, it is possible to detect the latter from the former.

A light flux emitted from the light source 208 is modulated, for example, by a chopper (illustration is omitted), guided to the light-transmitting side optical fiber bundle 204, proceeds inside respective optical fibers composing the light-transmitting side optical fiber bundle 204 and emits from one end side 202*a* of the complex optical fiber bundle 202. A measurement light emitted from the end side 202*a* passes through a vacuum glass window 111 sealed at a portion of the sidewall of the vacuum container 11 and the condenser lens 214, which are on an extension from the end side 202a, and is projected on (irradiated to) the monitor substrate S0 on which a thin film is being formed by depositing film materials.

The measurement light irradiated to the monitor substrate S0 enters from the surface side of the monitor substrate S0 (namely, the thin film formation side) and a part thereof transmits the thin film and monitor substrate S0, while the rest reflects on the thin film surface (In the case of a multilayer film, boundary surfaces of respective films are included. It will be the same below.) and on the monitor substrate S0 surface. A reflection light from the thin film surface and a reflection light from the monitor substrate S0 surface interfere with each other due to a phase difference of the both.

A reflection light from the monitor substrate S0 surface, which has as a reflection light intensity signal film thickness information of a thin film deposited on the monitor substrate S0, enters the end surface of the end side 202a of the complex optical fiber bundle 202. At the end side 202a of the complex optical fiber bundle 202, since both ends of the light-transmitting side optical fiber bundle 204 and the light-receiving side optical fiber bundle 206 are exposed, a part of the reflection light intensity (for example, a half) enters the light-receiving side optical fiber bundle 206, and the incident reflection light intensity passes through the dispersion optical system (illustration is omitted) explained above and enters the photoelectric conversion element 210. Intensity of a reflection light entered to the photoelectric conversion element 210 is converted to an electric signal, and transition of changes of reflection light intensity is displayed on a recorder (illustration is omitted) by a controller 212.

The controller 212 of the present embodiment is electrically connected to the control device 300 of the sputtering apparatus 1 and sends predetermined film thickness monitor data (change of reflection light intensity) to the control device 300 through an interface unit (illustration is omitted).

<Control Device>

As shown in FIG. 3, the sputtering apparatus 1 of the present embodiment comprises the control device 300. The control device 300 corresponds to "the control means" of the present invention.

The control device 300 of the present embodiment is a device for general control of the sputtering apparatus 1, such as starting and stopping of sputtering and adjusting of film forming time and film forming rate, etc. In addition thereto, the control device 300 performs predetermined processing based on the film thickness monitor data input from the controller 212 of the film thickness monitoring device 200. Details thereof will be explained later on.

The control device 300 comprises, for example, a CPU, memory (ROM and RAM), hard disk, input terminal and output terminal, etc.

The memory and hard disk, etc. of the control device 300 stores in advance film formation condition data necessary for film formation.

The film formation condition data includes, for example, an intended film thickness (for example, T1, T2, T3, T4 and T5) as an intended geometric film thickness of each of the film materials, interim film forming rate (interim rate, for example, Sa1 for thickness T1 and Sa2 for thickness T2) and interim film forming time (interim time, for example, time t1 obtained by dividing intended film thickness T1 by interim rate Sa1 and time t2 obtained by dividing intended film thickness T2 by interim rate Sa2) for each intended film thickness, an actual rate calculation program for calculating an actual film forming rate for forming a current thin film (actual rate, for example, actual rate Sb1 for forming a thin film having a thickness of T1 and actual rate Sb2 for forming a thin film having a thickness of T2, etc.) from film thickness monitor data input from the controller 212 (namely, current optical film thickness 'nd') and film forming time taken for forming the optical film thickness 'nd', and a necessary time calculation program for calculating film forming time required for forming at the actual rate a next thin film (second thin film: film C on film A (first thin film), film D on film B (first thin film) and film E on film C (first thin film)) having an intended film thickness (T3, T4 and T5), etc.

<Thin Film Formation Method>

Next, an explanation will be made on sputtering processing for producing a thin film by using the sputtering apparatus 1 with reference to the flowcharts (FIG. 4 and FIG. 6 to FIG. 8). In the present embodiment, an example of forming an optical multilayer film, wherein a silicon oxide ($SiO_2$) thin film and a niobium oxide ($Nb_2O_5$) thin film are alternately deposited respectively for three layers and two layers, namely, a multilayer film having a five-layer configuration of $SiO_2$—$Nb_2O_5$—$SiO_2$—$Nb_2O_5$—$SiO_2$, on a plurality of substrates S held on the rotation drum 13 will be explained.

Here, respective $SiO_2$ films formed as the first, third and fifth layers are referred to as film A, film C and film E, and respective $Nb_2O_5$ films formed as the second and fourth layers are referred to as film B and film D. Also, the film A as the first layer of the $SiO_2$ thin films and the film B as the first layer of the $Nb_2O_5$ thin films are considered as "first thin films", and the film C as the second layer of the $SiO_2$ films and the film D as the second layer of the $Nb_2O_5$ thin films as "second thin films". Furthermore, the case where the film C as the second layer of the $SiO_2$ thin films is considered as "first thin film" and the film E as the third layer of the $SiO_2$ thin films as "second thin film" will be explained as an example. Alternatively, as to the $SiO_2$ films, it is also possible not to consider the film A as the first thin film but consider only the film C as the first thin film.

Formation of the respective thin films is performed in the order of a step of preparing film formation, step of performing film formation and a step of finishing the film formation. In the step of performing film formation, the case of using silicon (Si) as the targets 29a and 29b, niobium (Nb) as the targets 49a and 49b, an argon gas as the sputtering gas to be introduced to the film formation process regions 20 and 40, and an oxygen gas as the reactive gas to be introduced to the reaction process region 60 will be explained as an example.

<S1>

First, an intended value is set (preparation for film formation). Specifically, as shown in FIG. 4, in step (hereinafter, referred to as abbreviated "S") 1, intended geometric film thicknesses (hereinafter, simply referred to as abbreviated "intended film thickness") T1 to T5 are set as well as an interim rate Sa1 and interim time t1, with which the film A formed as the first layer from a silicon material (also the first layer in total) can be formed to have a film thickness of T1. In the same way, an interim rate Sat and interim time t2 are set, with which the film B to be formed as the first layer from a niobium material (the second layer in total) can be formed to have a film thickness of T2. The respective conditions as above are set by inputting to the control device 300 (refer to FIG. 3) by an operator, for example, through a keyboard (illustration is omitted).

<S2>

Next comes preparation for the apparatus (preparation for film formation). Specifically, as shown in FIG. 1 to FIG. 4, targets 29a and 29b (or 49a and 49b) are held by magnetron sputtering electrodes 21a and 21b (or 41a and 41b) in S2. In the present embodiment, silicon (Si) is used as a material of the targets 29a and 29b, and niobium (Nb) is used as a material of 49a and 49b. In a state where the vacuum container 11 is tightly sealed, the vacuum pump 15 is activated for evacuation so as to bring inside the vacuum container 11 into a vacuum state of $10^{-2}$ Pa to 10 Pa or so. At this time, a valve (illustration is omitted) is open and the antenna housing chamber of the plasma source 80 is also evacuated at the same time.

After that, in a state where the rotation drum 13 is locked at a position of a load lock chamber (illustration is omitted), a plurality of substrates S (including a monitor substrate S0 to be monitored. It will be the same below) are attached to the rotation drum 13. Subsequently, a door (illustration is omitted) of the load lock chamber is closed and the vacuum pump 15 is activated to evacuate inside the load lock chamber, then, the door (illustration is omitted) between the load lock chamber and the vacuum container 11 is opened to transfer the rotation drum 13 to the vacuum container 11. After that, the door to the load lock chamber is closed, and a pressure inside the vacuum container 11 and inside the antenna housing chamber is reduced to a predetermined pressure as explained above. Then, after a pressure inside the vacuum container 11 and inside the antenna housing chamber is stabilized, a pressure in the film formation process region 20 is adjusted to 0.1 Pa to 1.3 Pa.

<S3>

Next, in S3, rotation of the rotation drum 13 starts inside the vacuum container 11. Rotation of the rotation drum 13 starts by an operator pressing a drum rotation switch (illustration is omitted) provided on an operation panel (illustration is omitted) of the sputtering apparatus 1. When the drum rotation switch is pressed, the motor 17 drives and the rotation drum 13 rotates. When a rotation rate of the rotation drum 13 becomes constant, the step proceeds to S4.

In the sputtering apparatus 1 of the present embodiment, a thin film is formed on the substrate S in the film formation process region 20 (or 40), and the thin film is subjected to oxidation processing in the reaction process region 60 after that, so that an interlayer thin film is formed on the surface of the substrate S. Therefore, when rotation of the rotation drum 13 is slow, the thin film to be formed in the film formation process region 20 (or 40) becomes thick and it becomes difficult to oxidize it completely in the reaction process region 60, which results in an inconvenient situation that an unhomogeneous thin film mixed with impurities is formed.

Also, in the oxidation step performed in the reaction process region 60, oxidation reaction of a thin film causes an expansion phenomenon of the thin film. An increase in volume as such results in a contraction stress inside the thin film. When a film thickness of a thin film formed in the film formation process region 20 (or 40) is thick, the generated thin film has less interstice structure between thin films and has a thin film structure wherein a silicon oxide (or niobium oxide) aggregates closely. Such a thin film is largely affected by a volume expansion caused by the oxidation reaction in the reaction process region 60. On the other hand, when the film thickness of the thin film formed in the film formation process region 20 (or 40) is thin, the generated thin film has lots of interstice structures arising between thin films. When volume expansion arises in such a thin film, the increased volume is absorbed by the interstice structures and a compression stress is hardly arises inside the thin film.

Furthermore, in the case where the rotation drum 13 rotates at a low rate, wobbling of the rotation becomes large, which makes it difficult to measure the film thickness accurately or to control the thin film formation processing. On the other hand, when the rotation drum 13 rotates at a high rate, a centrifugal force arising at a rotation portion of the rotation axis becomes large and stable rotation with less wobbling can be obtained.

As explained above, when the rotation rate of the rotation drum 13 is low, a variety of problems may arise. Therefore, the higher the rotation rate of the rotation drum 13 in the thin film formation processing, the more preferable, and 20 rpm or higher is particularly preferable.

<S4> First Layer

Next, in S4, formation of the first film (film A, the first thin film) starts. This processing is performed in the film formation process region 20 and in the reaction process region 60 in the present embodiment. In the film formation process region 20, sputtering of the targets 29a and 29b is performed to form a thin film (film A) composed of silicon and incomplete reactants of silicon on the surface of the substrate S. In the subsequent reaction process region 60, the thin film formed in the film formation process region 20 is subjected to oxidation processing, and an interlayer thin film mainly composed of silicon complete reactant is formed.

A sputtering start instruction in the film formation process region 20 is given from the control device 300 and film formation processing starts. The control device 300 gives the AC power source 23 and the high frequency power source 89 an instruction of applying an AC voltage respectively to the transformer 24 and the matching box 87. Due to this sputtering start instruction, sputtering of the first layer starts.

In the present embodiment, since the film A is formed to have an intended film thickness of T1, it is supposed that film formation is performed at the interim rate of Sa1 for the interim time t1 as set in S1. Accordingly, the control device 300 controls electric energy supplied to the magnetron sputtering electrodes 21a and 21b and an amount of sputtering gas to be supplied to the targets 29a and 29b, etc. to be suitable so as to attain the film forming rate of Sa1.

Note that it may be alternatively configured that a shield member (correcting board) for blocking the front side of the targets 29a and 29b is provided between the targets 29a and 29b and the substrate S and, when the sputtering start instruction is given, the shield member is moved from the front side of the targets 29a and 29b, so that the film materials can reach the substrate S from the targets 29a and 29b.

When the alternating electric field is applied to the targets 29a and 29b because of the sputtering start instruction, the targets 29a and 29b alternately become anode and cathode and plasma is formed in the film formation process region 20. Due to the plasma, sputtering of the targets 29a and 29b on cathode is performed (at the interim rate of Sa1).

Subsequently, the substrate S is transferred from a position facing to the film formation process region 20 to a position facing to the reaction process region 60 as the rotation drum 13 rotates. In the reaction process region 60, an oxygen gas is introduced as a reactive gas from the reactive gas cylinder 66.

In the reaction process region 60, the antennas 85a and 85b are applied with a high frequency voltage of 13.56 MHz and plasma is generated by the plasma source 80 in the reaction process region 60. A pressure of the reaction process region 60 is maintained preferably at 0.7 Pa to 1.0

Pa. Also, at least during plasma is generated in the reaction process region 60, a pressure inside the antenna housing chamber is maintained at $10^{-2}$ Pa or lower.

Then, when the rotation drum 13 rotates to transfer the substrate S, on which an interlayer thin film composed of silicon or incomplete silicon oxides ($SiO_{x1}$ ($x1<2$)) is formed, to the position facing to the reaction process region 60, a step of oxidation reaction of silicon or incomplete silicon oxides composing the interlayer thin film is performed by plasma processing. Namely, plasma of an oxygen gas generated in the reaction process region 60 by the plasma source 80 is used to bring the silicon or incomplete silicon oxides into oxidation reaction so as to convert it to incomplete silicon oxides having desired compositions ($SiO_{2x}$ ($x1<x2<2$)) or to a silicon oxide ($SiO_2$).

In the present embodiment, as a result that silicon or silicon incomplete oxides in the thin film formed in the film formation process region 20 is brought to oxidation reaction in the reaction process region 60 for converting to incomplete silicon oxides or a silicon oxide, an interlayer thin film composed only of complete oxide of silicon or an interlayer thin film comprising silicon and incomplete oxides of silicon at desired ratio is formed.

In the film composition conversion step in the reaction process region 60, a film thickness of an interlayer thin film obtained by film composition conversion in the reaction process region 60 becomes thicker than that of the thin film formed in the film formation process region 20. Namely, among the film materials composing the thin film formed in the film formation process region 20, silicon and incomplete oxides of silicon are converted to incomplete oxides of silicon and complete oxide of silicon, thereby, expansion of the thin film occurs and the film thickness becomes thick.

After that, at every rotation of the rotation drum 13, the sputtering processing in the film formation process region 20 and the oxidation processing in the reaction process region 60 are repeated. By repeating this for the designated interim time t1, interlayer thin film is deposited for a plurality of times on the surface of the substrate S and a thin film (corresponding to the film A as the first layer) logically having the intended film thickness of T1 is formed.

<S5>

As the film formation starts in S4 above, an operation of the film thickness monitoring device 200 starts in S5.

In the present embodiment, when the timing sensor 220 detects passing of the timing detecting reflection plate 132 attached at a rim of the upper side of the rotation drum 13 as a result of rotation of the rotation drum 13, a position detection signal thereof is input to the control device 300. After receiving the position detection signal from the timing sensor 220, the control device 300 activates the film thickness monitoring device 200 after a predetermined time. Specifically, a measurement light emitted on a steady basis from the light source 208 is transmitted in the light-transmitting side optical fiber bundle 204 and brought to irradiate from the end 202a of the complex optical fiber bundle 202 to inside the vacuum container 11. When the measurement light emitted on a steady basis from the light source 208 is irradiated into the vacuum container 11 at this moment, the measurement light is irradiated to the monitor substrate S0.

The measurement light irradiated to the monitor substrate S0 enters from the front surface side (namely, the thin film formation side) of the monitor substrate S0, and a part thereof transmits the thin film and the monitor substrate S0 but the rest reflects on the thin film surface and the monitor substrate S0 surface. The reflection light from the thin film surface and that from the monitor substrate S0 surface interfere with each other due to a phase difference of the two.

The reflection light reflected on the monitor substrate S0 surface is oriented to the end 202a of the complex optical fiber bundle 202. The reflection light entered to the end 202a of the complex optical fiber bundle 202 transmits through the light-receiving side optical fiber bundle 206 and introduced to the photoelectric conversion element 210 through the dispersion optical system (illustration is omitted) explained above.

In the photoelectric conversion element 210, a current in accordance with intensity of a light transmitted through the dispersion optical system explained above among the incident reflection light is generated, then, the current is output as a voltage signal amplified by an analog circuit. The controller 212, which received the output from the photoelectric conversion element 210, successively receives intensity of the reflection light from the monitor substrate S0 based on the voltage signal (intensity signal of the reflection light) input to the photoelectric conversion element 210 and outputs the same to the control device 300. Then the step proceeds to S6.

<S6>

Next, in S6, in the control device 300, detection values as successively received information of the reflection light intensity is plotted successively to obtain a light intensity change curve (a graph with time on axis of abscissa and reflection light intensity on axis of ordinate) at a predetermined wavelength, a change status of the curve is monitored and, when it is determined that the optical film thickness nd0 corresponding to an actual film thickness T0 reaches the optical film thickness nd1 corresponding to the intended film thickness T1, the step proceeds to S7. When determined that it is yet to be reached, the monitoring continues.

For example, as shown in FIG. 5, after starting the film formation, in the case where a point X (the reflection light intensity is 'a') around after passing the first extremal value (peak) is an optical film thickness nd1 corresponding to the intended film thickness T1, if a current optical film thickness nd0 is at a point Y (the reflection light intensity is a+α), it is determined yet to be reached. On the other hand, when the current optical film thickness nd0 is at a point Z (the reflection light intensity is 'a'), it is determined to be reached.

Normally, when forming the first layer using a new target material with no chipping arising thereon, a difference does not arise in the light intensity change curve as shown in FIG. 5, however, a difference of wavelength curve as such arises rarely due to an undesirous decline of sputtering power and decline of a flow amount of the sputtering gas supply, etc.

When considering the film A as "the first thin film" of the present invention, the steps in S5 and S6 correspond to "the film thickness monitoring step" of the present invention.

<S7>

Returning to FIG. 1 to FIG. 4. In S7, the control device 300 stops the supply of power and flowing of the sputtering gas to the electrodes 21a and 21b. Thereby, film formation of the first layer finishes and the step proceeds to S8 while continuing rotation of the rotation drum 13.

When considering the film A as "the first thin film" of the present invention, the step in S7 corresponds to "the stopping step" of the present invention.

<S8>

In S8, the control device 300 retrieves information of film forming time actually required from the start of the film formation in S4 till the end of the film formation in S7 (actual film forming time), and the step proceeds to S9. In the present embodiment, the rotation rate of the rotation drum 13 is already given, so that a measurement light is emitted from the light source 208 of the film thickness monitoring device 200 and intervals (time) of retrieving film thickness monitor data (information of reflection light intensity) input from the controller 212 to the control device 300 are obtained. Therefore, actual film forming time of a thin film is from the start of film formation (namely, retrieving of first film thickness monitor data) in S4 till the control device 300 determines termination of the film formation (retrieving of final film thickness monitor data) in S7. For example, when referring to FIG. 5, (t1+t1') is the actual film forming time. Below, an explanation will be made on the basis that the actual film forming time of the film A is (t1+t1').

Note that when considering the film A as "the first thin film" of the present invention, the step in S8 corresponds to "actual time acquisition step" of the present invention.

<S9>

Returning to FIG. 1 to FIG. 4. In S9, based on the film thickness of the thin film at this point (equal to the intended film thickness T1) and the actual film forming time (t1+t1') obtained in S8, the control device 300 calculates an actual film forming rate (actual rate Sb1) used in forming the current thin film (film A) and stores the same as an interim rate Sa3 to be used in forming a film C, which is another thin film but having the same composition as the film A, on the film B. Then, the step proceeds to S14. Calculation of the actual rate Sb1 is obtained by dividing the film thickness of the film A at this point (=intended film thickness T1) by the actual film forming time (t1+t1') obtained in S8.

Note that when considering the film A as "the first thin film" of the present invention, the step in S9 corresponds to "the actual rate calculation step" of the present invention.

For example, with referring to FIG. 5, when setting the interim rate Sa1 to 0.4 nm/sec in forming a $SiO_2$ thin film of 80 nm (intended film thickness T1) as the first layer on the substrate S, logically, when film formation is performed for the interim time t1=200 seconds, a $SiO_2$ thin film (film A) of 80 nm as the intended film thickness T1 should be formed (logical wavelength curve. Point X). However, when an actual film thickness T0 at the point is 76 nm from film thickness monitoring by the film thickness monitoring device 200, the actual rate Sb1 becomes (76/200)=0.38 nm/sec. Since 4 nm is in short for 80 nm, remaining time t1' is (4/0.38)=about 10.5 seconds, so that film formation has to be continued at the actual rate Sb1 for 10.5 seconds more. Only after this, an 80 nm $SiO_2$ thin film is formed on the substrate S (point Z).

<S14> Second Layer

As shown in FIG. 1 to FIG. 3 and FIG. 6, in S14, formation of the second layer (film B, the first thin film) starts. This processing is performed in the film formation process region 40 and in the reaction process region 60 in the present embodiment. In the film formation process region 40, sputtering of the targets 49a and 49b is performed and a thin film (film B) composed of niobium and incomplete reactants of niobium is formed on the surface of the film A on the substrate S. In the subsequent reaction process region 60, the thin film formed in the film formation process region 40 is subjected to oxidation processing and an interlayer thin film mainly composed of complete reactant of niobium is formed.

From the control device 300, an instruction of starting sputtering in the film formation process region 40 is given and thin film formation processing starts. The control device 300 gives the AC power source 43 and the high frequency power source 89 an instruction of applying an AC voltage to the transformer 44 and the matching box 87. Due to the sputtering start instruction, sputtering of the second layer starts.

In the present embodiment, since the film B is formed to have the intended film thickness of T2, it is supposed that film formation is performed at the interim rate of Sa2 for the interim time t2 as set in S1. Accordingly, the control device 300 controls electric energy supplied to the magnetron sputtering electrodes 41a and 41b and an amount of sputtering gas to be supplied to the targets 49a and 49b, etc. to be suitable so as to attain the film forming rate of Sa2.

Note that it may be alternatively configured that a shield member (correcting board) for blocking the front side of the targets 49a and 49b is provided between the targets 49a and 49b and the substrate S and, when the sputtering start instruction is given, the shield member is moved from the front side of the targets 49a and 49b, so that the film raw material substances can reach the substrate S from the targets 49a and 49b.

When the alternating electric field is applied to the targets 49a and 49b because of the sputtering start instruction, the targets 49a and 49b alternately become anode and cathode and plasma is formed in the film formation process region 40. Due to the plasma, sputtering of the targets 49a and 49b on cathode is performed (at the interim rate of Sa2).

Subsequently, the substrate S is transferred from a position facing to the film formation process region 40 to a position facing to the reaction process region 60 as the rotation drum 13 rotates. In the reaction process region 60, in the same way as in the first layer, an oxygen gas is introduced as a reactive gas from the reactive gas cylinder 66. Moreover, the antennas 85a and 85b are applied with a high frequency voltage of 13.56 MHz and plasma is generated by the plasma source 80.

Then, when the rotation drum 13 rotates to transfer the substrate S, on which an interlayer thin film composed of niobium or incomplete niobium oxides ($Nb_2O_{x1}$ (x1<5)) is formed, to the position facing to the reaction process region 60, a step of oxidation reaction of niobium or incomplete niobium oxides composing the interlayer thin film by plasma processing is performed. Namely, plasma of an oxygen gas generated in the reaction process region 60 by the plasma source 80 is used to bring the niobium or incomplete niobium oxides to oxidation reaction so as to convert it to an incomplete niobium oxides having a desired composition ($Nb_2O_{x2}$ (x1<x2<5)) or to a niobium oxide ($Nb_2O_5$).

In the present embodiment, as a result that niobium or niobium incomplete oxides in the thin film formed in the film formation process region 40 is brought to oxidation reaction in the reaction process region 60 to convert it to incomplete niobium oxides or a niobium oxide, an interlayer thin film composed only of a complete oxide of niobium or an interlayer thin film comprising niobium and incomplete oxides of niobium at desired ratio is formed.

In the film composition conversion step in the reaction process region 60, a film thickness of an interlayer thin film obtained by film composition conversion in the reaction process region 60 is thicker than that of the thin film formed in the film formation process region 40. Namely, among the film materials composing the thin film formed in the film formation process region 40, niobium and incomplete oxides of niobium are converted to incomplete oxides of niobium and a complete oxide of niobium, so that expansion of the thin film occurs and the film thickness becomes thick.

After that, at every rotation of the rotation drum 13, the sputtering processing in the film formation process region 40 and the oxidation processing in the reaction process region 60 are repeated. By repeating this during the designated interim time t2, an interlayer thin film is deposited for a plurality of times on the surface the film A on the substrate S, and a thin film (corresponding to the film B as the second layer) logically having the intended film thickness of T2 is formed.

<S15>

Next, in the same way as in S5, as the film formation starts in S14, an operation of the film thickness monitoring device 200 starts in S15, and the step proceeds to S16.

<S16>

Next, in the same way as in S6, in S16, in the control device 300, information of the reflection light intensity retrieved successively is plotted successively to obtain a light intensity change curve at a predetermined wavelength, a change status of the curve is monitored and, when the optical film thickness nd0 corresponding to an actual film thickness T0 reaches the optical film thickness nd2 corresponding to the intended film thickness T2, the step proceeds to S17. When determined that it is yet to be reached, the monitoring continues.

When considering the film B as "the first thin film" of the present invention, the steps in S15 and S16 correspond to "the film thickness monitoring step" of the present invention.

<S17>

In S17, the control device 300 stops supply of power and flowing of the sputtering gas to the electrodes 41a and 41b. Thereby, film formation of the second layer finishes and the step proceeds to S18 while continuing rotation of the rotation drum 13.

Note that when considering the film B as "the first thin film" of the present invention, the step in S17 corresponds to "the stopping step" of the present invention.

<S18>

In S18, the control device 300 retrieves information of film forming time actually required from the start of film formation in S14 till the end of the film formation in S17 (actual film forming time), and the step proceeds to S19. In the present embodiment, the rotation rate of the rotation drum 13 is already given as same as in S8, so that a measurement light is emitted from the light source 208 of the film thickness monitoring device 200 and intervals (time) of retrieving film thickness monitor data (information of reflection light intensity) input from the controller 212 to the control device 300 is obtained, therefore, actual film forming time of a thin film is from the start of film formation (namely, retrieving of first film thickness monitor data) in S14 till the control device 300 determines termination of the film formation (retrieving of final film thickness monitor data) in S17. Below, an explanation will be made on the basis that the actual film forming time of the film B is (t2+t2').

Note that when considering the film B as "the first thin film" of the present invention, the step in S18 corresponds to "the actual time acquisition step" of the present invention.

<S19>

In S19, based on the based on the film thickness of the thin film at this point (equal to the intended film thickness T2) and the actual film forming time (t2+t2') obtained in S18, the control device 300 calculates an actual film forming rate (actual rate Sb2) used in forming the current thin film (film B) and stores the same as an interim rate to be used in forming a film D, which is another thin film but having the same composition as the film B, on the film C. Then, the step proceeds to S24. Calculation of the actual rate Sb2 is obtained by dividing the film thickness of the film B at this point (=intended film thickness T2) by the actual film forming time (t2+t2') obtained in S18.

Note that when considering the film B as "the first thin film" of the present invention, the step in S19 corresponds to "the actual rate calculation step" of the present invention.

For example, when setting the interim rate Sat to 0.4 nm/sec in forming a $Nb_2O_5$ thin film of 80 nm (intended film thickness T2) as the second layer on the film A, logically, when film formation is performed for the interim time t2=200 seconds, a $Nb_2O_5$ thin film (film B) of 80 nm as the intended film thickness T2 should be formed. However, when an actual film thickness T0 at the point is 76 nm in film thickness monitoring by the film thickness monitoring device 200, the actual rate Sb2 becomes (76/200)=0.38 nm/sec. Since 4 nm is in short for 80 nm, remaining time t2' is (4/0.38)=about 10.5 seconds, so that film formation has to be continued at the actual rate Sb2 for 10.5 seconds more. Only after this, an 80 nm $Nb_2O_5$ thin film is formed on the film A on the substrate S.

<S24> Third Layer

As shown in FIG. 1 to FIG. 3 and FIG. 7, in S24, formation of the third layer (film C, the second thin film for the film A) starts. This processing is performed in the film formation process region 20 and in the reaction process region 60 in the same way as in S4. Chipping has arisen on the targets 29a and 29b to be used from the film formation of the first layer.

From the control device 300, an instruction to start sputtering in the film formation process region 20 is given and film formation processing starts. The control device 300 gives the AC power source 23 and the high frequency power source 89 an instruction of applying an AC voltage to the transformer 24 and the matching box 87. Due to the sputtering start instruction, sputtering of the third layer starts.

In the present embodiment, the film C is formed to have the intended film thickness of T3, however, since the targets 29a and 29b to be used have chipping thereon, a decline of film forming rate comparing with the film forming rate (interim rate Sa1) before the chipping is anticipated even if the output on the sputtering electrode side is kept constant. Therefore, in the present embodiment, the actual film forming rate used in forming the film A (actual rate Sb1) stored in S9 is set as the interim rate Sa3, and time t3 necessary for forming a film having an intended film thickness of T3 at the rate is calculated so as to control the film formation to be performed during the time. Calculation of the t3 corresponds to "the necessary time calculation step" of the present invention when considering the film A as "the first thin film" and the film C as "the second thin film". The 't3' can be obtained by dividing T3 by Sb1. Accordingly, the control device 300 controls to perform film formation at the interim rate of Sa3 (same as the actual rate Sb1 for the film A stored in S9) exactly for time t3 for forming the film C. Then, the step proceeds to S25.

After that, at every rotation of the rotation drum 13, the sputtering processing in the film formation process region 20 and the oxidation processing in the reaction process region 60 are repeated. By repeating this during the designated film forming time t3, an interlayer thin film is deposited for a plurality of times on the surface the film B on the substrate S, and a thin film (corresponding to the film C as the third layer) logically having the intended film thickness of T3 is formed.

<S25>

Next, in the same way as in S5 and S15, as the film formation starts in S24, an operation of the film thickness monitoring device 200 starts in S25, and the step proceeds to S26.

<S26>

Next, in the same way as in S6 and S16, in S26, in the control device 300, information of the reflection light intensity retrieved successively is plotted successively to obtain a light intensity change curve at a predetermined wavelength, a change status of the curve is monitored and, when it is determined that the current optical film thickness nd0 reaches the optical film thickness nd3 corresponding to the intended film thickness T3, the step proceeds to S27. When determined that it is yet to be reached, the monitoring continues.

<S27>

In S27, the control device 300 stops the supply of power and flowing of the sputtering gas to the electrodes 21a and 21b. Thereby, film formation of the third layer finishes and the step proceeds to S28 while continuing rotation of the rotation drum 13.

Note that the film C is considered as the second thin film of the film A (the first thin film) in the present embodiment, however, when considering the film C as "the first thin film" of the present invention, the step in S27 corresponds to "the stopping step" of the present invention.

<S28>

In S28, the control device 300 retrieves information of film forming time actually required from the start of film formation in S24 till the end of the film formation in S27 (actual film forming time), and the step proceeds to S29. Below, an explanation will be made on the basis that the actual film forming time of the film C is (t3+t3').

Note that the film C is considered as the second thin film of the film A (the first thin film) in the present embodiment, however, when considering the film C as "the first thin film" of the present invention, the step in S28 corresponds to "the actual time acquisition step" of the present invention.

<S29>

In S29, based on the film thickness of the thin film at this point (equal to the intended film thickness T3) and the actual film forming time (t3+t3') obtained in S28, the control device 300 calculates an actual film forming rate (actual rate Sb3) used in forming the current thin film (film C) and stores the same as an interim rate to be used in forming a film E, which is another thin film but having the same composition as the film C, on a later-explained film D. Then, the step proceeds to S34. Calculation of the actual rate Sb3 is obtained by dividing the film thickness of the film C at this point (=intended film thickness T3) by the actual film forming time (t3+t3') obtained in S28.

The film C is considered as the second thin film of the film A (the first thin film) in the present embodiment, however, when considering the film C as "the first thin film" of the present invention, the step in S29 corresponds to "the actual rate calculation step" of the present invention.

For example, when forming a $SiO_2$ thin film of 80 nm (intended film thickness T3) as the third layer on the film B, the interim rate Sa3 is set to 0.38 nm/sec which is the actual rate Sb1 of the film A calculated in S9. In that case, logically, when film formation is performed for the interim time t3=210.5 seconds, a $SiO_2$ thin film (film C) of 80 nm as the intended film thickness T3 should be formed. However, when an actual film thickness T0 at the point is 76 nm in film thickness monitoring by the film thickness monitoring device 200, the actual rate Sb3 becomes (76/210.5)=0.36 nm/sec. Since 4 nm is in short for 80 nm, remaining time t1' is (4/0.36)=about 11.1 seconds, so that film formation has to be continued at the actual rate Sb3 for 11.1 seconds more. Only after this, an 80 nm $SiO_2$ thin film is formed on the film B.

<S34> Fourth Layer

As shown in FIG. 1 to FIG. 3 and FIG. 8, in S34, formation of the fourth layer (film D, the second thin film) starts. This processing is performed in the film formation process region 40 and in the reaction process region 60 in the same way as in S14. Chipping has arisen on the targets 49a and 49b to be used from the film formation of the second layer.

From the control device 300, an instruction to start sputtering in the film formation process region 40 is given and film formation processing starts. The control device 300 gives the AC power source 43 and the high frequency power source 89 an instruction of applying an AC voltage respectively to the transformer 44 and the matching box 87. Due to the sputtering start instruction, sputtering of the fourth layer starts.

In the present embodiment, the film D is formed to have the intended film thickness of T4, however, since the targets 49a and 49b to be used have chipping thereon, a decline of film forming rate comparing with the film forming rate (interim rate Sat) before the chipping is anticipated even if the output on the sputtering electrode side is kept constant. Therefore, in the present embodiment, the actual film forming rate in forming the film B (actual rate Sb2) stored in S19 is set as the interim rate Sa4, and time t4 necessary for forming a film having an intended film thickness of T4 at the rate is calculated so as to control the film formation to be performed during that time. Calculation of the t4 corresponds to "the necessary time calculation step" of the present invention when considering the film B as "the first thin film" and the film D as "the second thin film". The 't4' can be obtained by dividing T4 by Sb2. Accordingly, the control device 300 controls to perform film formation at the interim rate of Sa4 (same as the actual rate Sb2 of the film B stored in S19) exactly for time t4 for forming the film D. Then, the step proceeds to S37.

As a result, at every rotation of the rotation drum 13, the sputtering processing in the film formation process region 40 and the oxidation processing in the reaction process region 60 are repeated. By repeating this during the designated film forming time t4, an interlayer thin film is deposited for a plurality of times on the surface of the film C on the substrate S, and a thin film (corresponding to the film D as the fourth layer) logically having the intended film thickness of T4 is formed.

<S37>

In S37, the control device 300 stops supply of power and flowing of a sputtering gas to the electrodes 41a and 41b. Thereby, film formation of the fourth layer finishes, and the step proceeds to S44 while continuing rotation of the rotation drum 13.

For example, when forming a $Nb_2O_5$ thin film of 80 nm (intended film thickness T4) as the fourth layer on the film C, the interim rate Sa4 is set to 0.38 nm/sec which is the actual rate Sb2 of the film B calculated in S19. In that case, logically, when film formation is performed for the interim time t4=210.5 seconds, a $Nb_2O_5$ thin film (film D) of 80 nm as the intended film thickness T4 should be formed. However, when an actual film thickness T0 at the point is 76 nm in film thickness monitoring by the film thickness monitoring device 200, the actual rate Sb4 becomes (76/210.5)=0.36 nm/sec. Since 4 nm is in short for 80 nm, remaining time t4' is (4/0.36)=about 11.1 seconds, so that film formation has to be continued at the actual rate Sb4 for 11.1 seconds more. Only after this, an 80 nm Nb$_2$O$_5$ thin film is formed on the film C.

<S44> Fifth Layer

In S44, film formation of the fifth layer (film E, the second thin film when the film C is considered as the first thin film) starts. This processing is performed in the film formation process region 20 and in the reaction process region 60 in the same way as in S4 and S24. Further chipping has arisen on the targets 29a and 29b to be used from the film formation of the first layer and third layer.

From the control device 300, an instruction to start sputtering in the film formation process region 20 is given and film formation processing starts. The control device 300 gives the AC power source 23 and the high frequency power source 89 an instruction of applying an AC voltage respectively to the transformer 24 and the matching box 87. Due to the sputtering start instruction, sputtering of the fifth layer starts.

In the present embodiment, the film E is formed to have the intended film thickness of T5, however, since the targets 29a and 29b to be used have further chipping comparing with that in forming the film C, a decline of film forming rate comparing with that before the chipping (interim rate Sa3 as same as the actual rate Sb1 for the film A) is anticipated even if the output on the sputtering electrode side is kept constant. Therefore, in the present embodiment, the actual film forming rate in forming the film C (actual rate Sb3) calculated in S28 is set as an interim rate Say, and time t5 necessary for forming a film having an intended film thickness of T5 at the rate is calculated so as to control the film formation to be performed during that time. Calculation of the t5 corresponds to "the necessary time calculation step" of the present invention when considering the film C as "the first thin film" and the film E as "the second thin film". The 't5' can be obtained by dividing T5 by Sb3. Accordingly, the control device 300 controls to perform film formation at the interim rate of Sa5 (same as the actual rate Sb3 stored in S29) exactly for time t5 for forming the film E. Then, the step proceeds to S47.

As a result, at every rotation of the rotation drum 13, the sputtering processing in the film formation process region 20 and the oxidation processing in the reaction process region 60 are repeated. By repeating this during the designated film forming time t5, an interlayer thin film is deposited for a plurality of times on the surface of the film D on the substrate S, and a thin film (corresponding to the film E as the fifth layer) logically having the intended film thickness of T5 is formed.

<S47>

In S47, the control device 300 stops supply of power and flowing of a sputtering gas to the electrodes 21a and 21b. Thereby, film formation of the fifth layer is finished and all film formation is finished.

For example, when forming a SiO$_2$ thin film of 80 nm (intended film thickness T5) as the fifth layer on the film D, the interim rate Sa5 is set to 0.36 nm/sec which is the actual rate Sb3 for the film C calculated in S29. In that case, logically, when film formation is performed for the interim time t3=221.6 seconds, a SiO$_2$ thin film (film E) of 80 nm as the intended film thickness T5 should be formed. However, when an actual film thickness T0 at the point is 76 nm in film thickness monitoring by the film thickness monitoring device 200, the actual rate Sb5 becomes (76/221.6)=0.34 nm/sec. Since 4 nm is in short for 80 nm, remaining time t5' is (4/0.34)=about 11.8 seconds, so that film formation has to be continued at the actual rate Sb5 for 11.8 seconds more. Only after this, an 80 nm SiO$_2$ thin film is formed on the film D.

As explained above, according to the present embodiment, the actual rate Sb1 in forming the film A as the first layer to have the intended film thickness of T1 is set to the interim rate Sa3 in forming the film C on the film B, film forming time t3 required for forming the film C is calculated based on the interim rate and the intended film thickness T3, and film formation of the film C is performed for the time t3. Also, the actual rate Sb2 in forming the film B as the second layer is set to the interim rate Sa4 in forming the film D on the film C, film forming time t4 required for forming the film D is calculated based on the interim rate and the intended film thickness T4 of the film D, and film formation of the film D is performed for the time t4. Furthermore, the actual rate Sb3 in forming the film C as the third film to have the intended film thickness of T3 is set to the interim rate Say in forming the film E on the film D, film forming time t5 required for forming the film E is calculated based on the interim rate and the intended film thickness T5 of the film E, and film formation of the film E is performed for the time t5. Accordingly, needless film formation for trial film formation can be omitted, and the film formation efficiency can be improved.

It was already explained above that, normally, when chipping arises on targets, estimated film forming rate cannot be obtained and it declines.

In the present embodiment, actual rates Sb1 and Sb2 are calculated from the initial stage of the thin film formation (the first and second layers in film formation of a SiO$_2$ film and Nb$_2$O$_5$ film), and they are reflected in film forming rates for subsequent thin film formation (a SiO$_2$ film and Nb$_2$O$_5$ film as the third and fourth layers and SiO$_2$ film as the fifth layer). However, calculation of an actual rate may start from the second or later layer in thin film formation (for example, the film C and thereafter based on the film A) and it can be reflected in a film forming rate in subsequent thin film formation.

The invention claimed is:

1. A multilayer thin film formation method for sputtering a target to form a first thin film having an intended film thickness on a substrate held and rotated by a substrate holding means and, subsequently, forming on the first thin film a first other thin film having an intended film thickness and a different composition from that of the first thin film, further sputtering the target having chipping generated thereon used for forming the first thin film to form on the first other thin film formed on the first thin film a second thin film having an intended film thickness, which is another thin film having the same composition as the first thin film, and, subsequently, further forming on the second thin film a second other thin film having an intended film thickness and a different composition from that of the first thin film and the second thin film, and furthermore forming a multilayer thin film on a substrate by alternately depositing a plurality of two kinds of single-layer thin films (a first thin film and first other thin film or a second thin film and second other thin film) composed of the different materials, by repeating formation of a first thin film and first other thin film and formation of a second thin film and second other thin film on the second other thin film formed on a second thin film:

wherein a film thicknesses of a first thin film and second thin film are monitored by a film thickness monitoring means while forming respective first thin film and second thin film, the same target is used during forming respective first thin film and second thin film, and under a state where an output of a sputtering electrode is kept constant by supplying constant electric power to the sputtering electrode for sputtering the target, the method comprising:

a first thin film formation step for obtaining a first thin film having an intended film thick ness by monitoring an actual film thickness of the first thin film based on first thin film thickness monitoring data including change of reflection light amount sent from a film thickness monitoring means while forming the first thin film by supplying a film material to a substrate at a preset tentative film forming rate of the first thin film and stopping supply of the film material at a point where an actual film thickness of the first thin film reaches an intended film thickness;

an actual rate calculation step of a first thin film for obtaining information of actual film forming time, which is an actual time for forming the first thin film required from start of supplying a film material till termination of the supply and calculating an actual film forming rate of a first thin film, which is a film forming rate actually used for forming the first thin film to be an intended film thickness based on the obtained actual film forming time;

a second thin film formation step for obtaining a second thin film having an intended film thickness by monitoring an actual film thickness of the second thin film based on second thin film thickness monitoring data sent from a film thickness monitoring means while forming a second thin film by using the target having chipping generated thereon used for forming a first thin film and supplying at an actual film forming rate of the first thin film a film material to the first other thin film formed on a first thin film, and stopping supply of a film material at a point where an actual film thickness of a second thin film reaches an intended film thickness;

an actual rate calculation step for obtaining information of actual film forming time, which is an actual time for forming a second thin film required from start of supplying a film material till termination of the supply and calculating an actual film forming rate of a second thin film, which is an actual rate of forming a second thin film, based on the obtained actual film forming time;

wherein, when forming a second and succeeding layers of a first thin film having an intended film thickness, an actual film forming rate of a preceding already formed second thin film is set as a tentative film forming rate for supplying a film material and, furthermore, when forming a second and succeeding layers of a second thin film having an intended film thickness, an actual film forming rate of a preceding already formed first thin film is set as a tentative film forming rate for supplying a film material, so that an optical multilayer film, wherein a plurality of the two kinds of single-layer thin films composed of different materials are deposited alternately, is formed.

2. The multilayer thin film formation method according to claim 1, wherein an optical film thickness of the first thin film is monitored in the film thickness monitoring step.

3. The multilayer thin film formation method according to claim 2, wherein optical reflection type film thickness monitoring device is used.

4. A multilayer thin film formation apparatus for sputtering a target to form a first thin film having an intended film thickness on a substrate held and rotated by a substrate holding means and, subsequently, forming on the first thin film a first other thin film having an intended film thickness and a different composition from that of the first thin film, further sputtering a target having chipping generated thereon used for forming a first thin film to form on the first other thin film formed on a first thin film a second thin film having an intended film thickness, which is another thin film having the same composition as a first thin film and, subsequently, furthermore forming on the second thin film a second other thin film having an intended film thickness an a different composition from that of the first thin film and second thin film, and furthermore forming a multilayer thin film on a substrate by alternately depositing a plurality of two kinds of single-layer thin films (a first thin film and first other thin film or a second thin film and second other thin film) composed of the different materials, by repeating formation of a first thin film and first other thin film and formation of a second thin film and second other thin film on the second other thin film formed on a second thin film:

comprising:

an electric power source configured to supply electric power to a sputtering electrode for sputtering the target;

a substrate holding means provided inside a vacuum container and formed on a side surface in a rotation direction of a rotation means, which is rotatable about an axis;

a sputtering means for forming the first thin film and the second thin film respectively having intended film thicknesses by using a same target;

a film thickness monitoring means for monitoring a film thickness of the first thin film and second thin film while forming the first thin film and second thin film respectively; and a control means;

wherein the control means (1) controls the electric power source to supply constant electric power to a sputtering electrode for sputtering the target while forming the first thin film and second thin film and controls an output of the sputtering electrode side to be in a constant state (2) while forming a first thin film by starting supply of a film material to a substrate at a preset tentative film forming rate for a first thin film, monitors an actual film thickness of the first thin film based on first thin film thickness monitoring data including change of reflection light amount sent from a film thickness monitoring means, stops supply of a film material at a point where an actual film thickness of the first thin film reaches an intended film thickness and, after controlling to form a first thin film having an intended film thickness, obtains information of actual film forming time, which is actual time for forming a first thin film required from start of supply of a film material till termination of the supply, and calculates an actual film forming rate of a first thin film, which is an actual film forming rate for forming a first thin film having an intended film thickness based on the obtained actual film forming time;

(3) while forming a second thin film by using a target having chipping generated thereon used for forming a first thin film and starting supply of a film material to the first other thin film formed on a first thin film at an actual film forming rate of a first thin film, monitors an actual film thickness of the second thin film based on film thickness monitoring data sent from a film thickness monitoring means, stops supply of a film material at a point where an actual film thickness of a second thin film reaches an intended film thickness and, after formation of a second thin film having an intended film thickness, obtains information of an actual film forming time, which is an actual time for forming a second thin film required from start of supply of a film material till termination of the supply, and calculates an actual film forming rate for a second thin film, which is a film forming rate for actually forming a second thin film based on the obtained actual film forming time;

(4) when forming a second and succeeding layers of a first thin film having intended film thickness, a film material is supplied by setting an actual film forming rate of an already-formed preceding second thin film as a tentative film forming rate and, furthermore, when forming a second and succeeding layers of a second thin film having an intended film thickness, a film material is supplied by setting an actual film forming rate of an already-formed preceding first thin film as a tentative film forming rate, so that an optical multilayer film, wherein a plurality of the two kinds of single-layer thin films composed of different materials are deposited alternately, is formed.

5. The multilayer thin film formation apparatus according to claim 4, wherein the control means is configured to form a third thin film using the actual film forming rate determined in forming the first thin film and setting the actual film forming rate as an interim rate, and calculating a time necessary for forming the third thin film having an intended film thickness.

6. The multilayer thin film formation apparatus according to claim 4, wherein the control means is configured to form a third thin film having a same composition as the first thin film, and use a same target while forming each of the first thin film, second thin film, and third thin film.

7. The multilayer thin film formation method according to claim 1, further comprising:

forming a third thin film using the actual film forming rate determined in forming the first thin film and setting the actual film forming rate as an interim rate, and calculating a time necessary for forming the third thin film having an intended film thickness.

8. The multilayer thin film formation method according to claim 1, further comprising:

forming a third thin film having a same composition as the first thin film, and using a same target while forming each of the first thin film, second thin film, and third thin film.

* * * * *